(12) United States Patent
Franken et al.

(10) Patent No.: US 7,897,941 B2
(45) Date of Patent: Mar. 1, 2011

(54) LITHOGRAPHIC APPARATUS, DEVICE MANUFACTURING METHOD, AND USE OF A RADIATION COLLECTOR

(75) Inventors: Johannes Christiaan Leonardus Franken, Knegsel (NL); Alexander Matthijs Struycken, Eindhoven (NL); Leon Joseph Marie Van Den Schoor, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 303 days.

(21) Appl. No.: 12/289,778

(22) Filed: Nov. 4, 2008

(65) Prior Publication Data
US 2009/0066924 A1 Mar. 12, 2009

Related U.S. Application Data

(62) Division of application No. 11/253,054, filed on Oct. 19, 2005, now Pat. No. 7,462,841.

(51) Int. Cl.
G01N 21/33 (2006.01)
G03B 27/72 (2006.01)
B08B 3/10 (2006.01)

(52) U.S. Cl. .............. 250/492.2; 250/492.22; 250/492.1; 250/504 R; 250/372; 355/30; 378/34; 378/185

(58) Field of Classification Search .......... 250/492.2, 250/492.22, 492.1, 504 R, 372; 355/30; 378/34, 185
See application file for complete search history.

(56) References Cited

U.S. PATENT DOCUMENTS

| 6,964,485 | B2 | 11/2005 | Singer et al. |
| 7,088,424 | B2 | 8/2006 | Bakker et al. |
| 7,355,672 | B2* | 4/2008 | Van Herpen et al. .......... 355/30 |
| 7,414,700 | B2* | 8/2008 | Van Herpen et al. .......... 355/53 |
| 7,462,841 | B2* | 12/2008 | Franken et al. ........... 250/492.2 |
| 7,470,916 | B2* | 12/2008 | Box et al. ................... 250/428 |
| 7,473,908 | B2* | 1/2009 | Van Herpen et al. ..... 250/492.2 |
| 2003/0043455 | A1 | 3/2003 | Singer et al. |
| 2004/0109151 | A1 | 6/2004 | Bakker et al. |
| 2005/0105066 | A1 | 5/2005 | Franken |

(Continued)

FOREIGN PATENT DOCUMENTS

JP 04-273116 A 9/1992

(Continued)

OTHER PUBLICATIONS

Notice of Allowance issued for U.S. Appl. No. 11/455,943, dated Oct. 7, 2008.

(Continued)

*Primary Examiner*—Nikita Wells
(74) *Attorney, Agent, or Firm*—Pillsbury Winthrop Shaw Pittman LLP

(57) ABSTRACT

A lithographic apparatus, comprising a collector being constructed to receive radiation from a radiation source and transmit radiation to an illumination system, wherein the collector is provided with at least one fluid duct, the apparatus including a temperature conditioner to thermally condition the collector utilizing the fluid duct of the collector, the temperature conditioner being configured to feed a first fluid to the fluid duct during a first period, and to feed a second fluid to the fluid duct during at least a second period.

20 Claims, 2 Drawing Sheets

U.S. PATENT DOCUMENTS

2005/0157284 A1 7/2005 Moors et al.
2007/0084461 A1 4/2007 Box et al.

FOREIGN PATENT DOCUMENTS

| JP | 11-191525 A | 7/1999 |
| JP | 2001-237181 A | 8/2001 |
| JP | 2003-282398 A | 10/2003 |

OTHER PUBLICATIONS

Notification of Reason(s) for Refusal for Japanese Patent Application No. 2006-283977 dated Jan. 19, 2010.

* cited by examiner

LITHOGRAPHIC APPARATUS, DEVICE MANUFACTURING METHOD, AND USE OF A RADIATION COLLECTOR

This application is a divisional application of U.S. patent application Ser. No. 11/253,054, filed on Oct. 19, 2005 now U.S. Pat. No. 7,462,841, the entire contents of which is incorporated herein by reference.

FIELD

The present invention relates to a lithographic apparatus. The invention further relates to a method of manufacturing a device, as well as a use of a radiation collector. Also, the invention can relate to a method to remove contamination from a radiation collector.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The known apparatus can comprise a collector for collecting radiation from a radiation source. The collector can be arranged to transmit the collected radiation to an illumination system. Such an illumination system can be arranged to provide a projection beam of radiation, which is used to apply a desired pattern onto a target portion of a substrate. The collector can comprise, for example, suitable radiation reflecting mirror shells. Particularly, the collector can be arranged to focus incoming radiation, received from the radiation source, onto a small focusing area or focusing point.

During use, the collector can become contaminated with various substances. For example, in case the radiation source is a Sn radiation source, collector surfaces can be contaminated by tin (Sn) and/or tin-oxide (SnOx) contamination. Such contamination can have a negative effect on the performance of the collector. In a mentioned Sn radiation source, usually, a plasma is formed by heating up Sn atoms. Various methods are known to remove contamination from the collector. However, the known methods are relatively complex, expensive to implement, and relatively inefficient.

SUMMARY

Embodiments of the invention include a lithographic apparatus wherein collector contamination can be removed in a relatively simple manner.

According to an embodiment of the invention, there is provided a lithographic apparatus, comprising a collector being constructed to receive radiation from a radiation source and transmit radiation to an illumination system, wherein the collector is provided with at least one fluid duct, the apparatus comprising a temperature conditioner to thermally condition the collector utilizing the fluid duct of the collector, the temperature conditioner being configured to feed a first fluid to the fluid duct during a first period, and to feed a second fluid to the fluid duct during at least a second period.

According to an embodiment of the invention, a lithographic apparatus comprises: an illumination system constructed to provide a beam of radiation; a support structure constructed to support a patterning device, the patterning device serving to impart a cross-section of the beam with a pattern to form a patterned beam; a substrate table for holding a substrate; a projection system that projects the patterned beam onto a target portion of the substrate; a collector being constructed to receive radiation from a radiation source and transmit radiation to the illumination system; and a temperature conditioner configured to feed a liquid to the collector to cool the collector during a first period, and to feed a gas or gas mixture to the collector to heat the collector during at least a second period.

In an embodiment, there is provided a method of manufacturing a device, comprising: providing a substrate; providing a radiation source; transmitting radiation from the radiation source to an illumination system through a collector; providing a beam of radiation using the illumination system; imparting the beam with a cross-sectional pattern to form a patterned beam of radiation; and projecting the patterned beam of radiation onto a target portion of the substrate; wherein the collector can be thermally conditioned using a first fluid during at least a first period when the collector receives radiation from the radiation source, wherein the collector is being heated using a second fluid during a second period when the collector does not receive radiation from the radiation source.

Also, an embodiment of the invention provides a use of a radiation collector, wherein the collector is provided with at least one fluid duct, wherein during a first period a first fluid is supplied to the fluid duct to remove heat from the collector, wherein a second fluid is supplied to the fluid duct of the collector during at least a second period to supply heat to the collector.

Besides, in an embodiment, a method of manufacturing a device comprises: transmitting radiation from a radiation source to an illumination system through a collector, maintaining the collector at a certain operating temperature, or in a certain operating temperature range, by supplying a first fluid to at least one fluid duct of the collector; and projecting a beam of radiation onto a target portion of a substrate, wherein the method includes at least one contamination removal period, wherein during that contamination removal period a second fluid is supplied to the at least one fluid duct of the collector to heat the collector.

Also, an embodiment of the invention provides a method to remove contamination from reflecting surfaces of a radiation collector, wherein heated air is being brought in thermal contact with the collector, to heat up the collector to a temperature wherein at least part of the contamination is removed from the collector.

BRIEF DESCRIPTION OF THE DRAWINGS

Embodiments will now be described, by way of example only, with reference to the accompanying schematic drawings in which corresponding reference symbols indicate corresponding parts, and in which.

DETAILED DESCRIPTION

Figure 1:
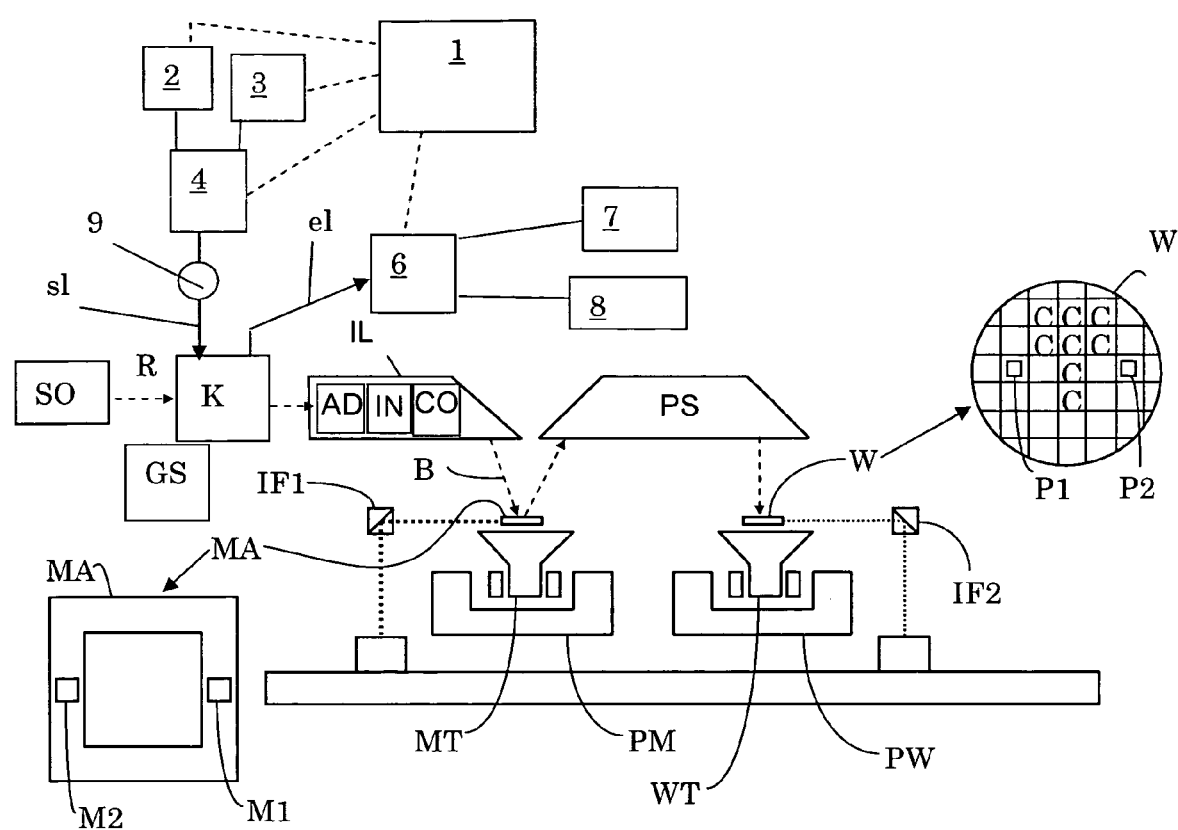
FIG. 1 depicts an embodiment of a lithographic apparatus.

FIG. 1 schematically depicts an embodiment of a lithographic apparatus. The apparatus comprises:

- an illumination system (illuminator) IL configured to condition a radiation beam B (e.g. UV radiation, Extreme UV radiation, or an other type of radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO, for example via a radiation collector K. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system K comprising, for example, suitable directing mirrors and/or a beam expander, and/or for example a collector K. In other cases the source may be an integral part of the lithographic apparatus, for example when the source is a mercury lamp. The source SO and the illuminator IL, together with the beam delivery system K if required, may be referred to as a radiation system. In an embodiment, the radiation source is a tin (Sn) plasma EUV source. For example, in such a radiation source, Sn atoms can be heated (such as electrically) using a low power laser. The EUV radiation source can also be a different radiation source, for example a Li or Xe 'fueled' plasma radiation source.

The illuminator IL may comprise an adjuster AD for adjusting the angular intensity distribution of the radiation beam. Generally, at least the outer and/or inner radial extent (commonly referred to as s-outer and s-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Being reflected on the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies. The depicted apparatus could be used in at least one of the following modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
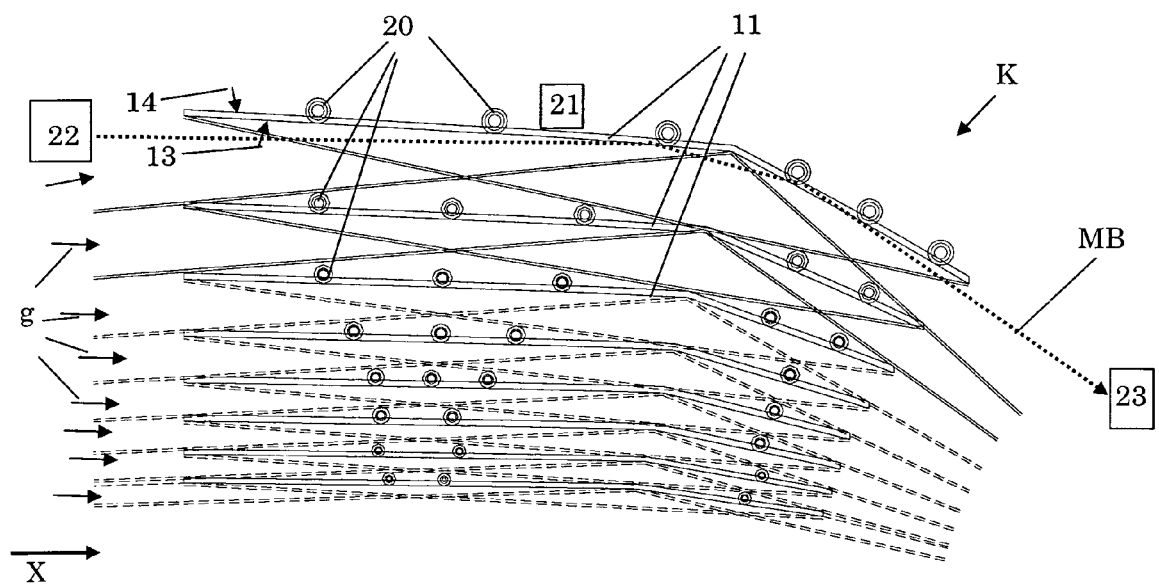
FIG. 2 schematically shows a longitudinal cross-section of part of an embodiment of a collector.
Figure 3:
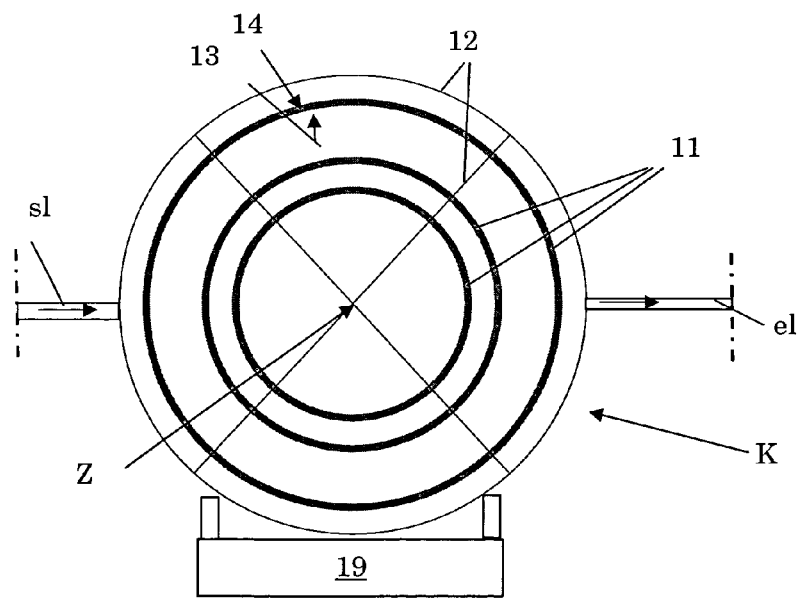
FIG. 3 schematically depicts a front view, in a direction X, of the embodiment of FIG. 2.

FIGS. 2-3 schematically show—in more detail—a collector K (or 'beam delivery system') of the lithographic apparatus as shown in FIG. 1. The collector K can comprise mirrors 11 for focusing the radiation R, which radiation the collector K receives from a radiation source SO during a certain operational period of the apparatus. The radiation source SO is depicted in FIG. 1, but not in FIGS. 2-3.

The collector K may be arranged at least partly according to the collector as known from EP 1 225 481, or in a different manner. For instance, the collector may be suitable for illumination systems with a wavelength of <=than about 193 nm, preferably <=than about 126 nm, particularly preferred, EUV wavelengths. In an embodiment, the collector comprises a plurality of reflecting elements 11 in the form of rotationally symmetrical mirror shells, which are arranged in one another around a common axis of rotation Z (see FIG. 3). The collector shells 11 can be attached to each other for instance by coupling members 12, for example spokes or spoke-like elements or other suitable coupling members, as has been depicted in FIG. 3. These coupling members 12 are not depicted in FIG. 2. Also, for example, the collector K can be provided with a suitable holder or support structure 19, for holding and/or supporting the collector K. Such a collector holder or support structure 19, which can be configured in various ways, is schematically depicted in FIG. 3. Each reflecting element 11 can comprise a reflecting inner surface 13 for reflecting the radiation R, as well as an outer surface 14 or back side which is faced away from the reflecting surface 13, see FIGS. 2 and 3. Each of the reflecting elements 11 can themselves have a relatively good thermal conductance, to provide a relatively good thermal uniformity of the element 11 during use. For example, each of the reflecting elements 11 can be substantially made of one or more materials of relatively high thermal conductivities, for example one or more suitable metals and/or alloys, as will be appreciated by one skilled person. The collector parts can be assembled and/or formed in various ways, for example utilizing a suitable electroforming process, and/or in an other way. For example, in an electroforming process of a collector element 11, mandrills (for example Aluminum solids) are produced. On the mandrills, e.g. a Cu or Ni layer, or a different layer, can be gradually deposited to form the collector element 11. By rapidly cooling down the mandrill, the element 11 can come loose in one piece. Finally a reflective coating can be applied to the collector element 11.

The collector K can be arranged to focus the incoming radiation R onto a certain focus point. The focus point may be, for instance, a small focusing area. The focus point may be situated, for instance, before the illuminator IL of the lithographic apparatus.

During use of the apparatus in a device manufacturing method, the collector K can be heated by the incoming radiation R. To thermally condition the collector K, for example to remove at least part of the heat from the collector K, the present collector embodiment K is provided with a number of fluid ducts 20. A number of these ducts are depicted, in cross-section, in FIG. 2. The fluid ducts can be used to direct or conduct a suitable first fluid (e.g. a cooling fluid) along and/or through heated collector parts, such as along and/or through collector reflecting elements 11, collector coupling members 12, collector holder or support 19, and/or other collector parts.

The fluid ducts 20 of the collector K can be arranged and configured in various ways. For example, the collector K can be provided with only one fluid duct, which extends along a suitable path along and/or through the collector K to feed fluid along and/or through the collector. Besides, the fluid duct can include a plurality of sub-fluid ducts. For example, the collector K can be provided with a network or system of fluid ducts 20. The fluid duct(s) 20 can be branched off in a suitable fashion to reach certain parts of the collector K which are to be thermally conditioned, using fluid. One or more of the fluid ducts 20 can, for example, spiral along and/or through a respective reflecting element 11 of the collector K, for example having a spiral axis which coincides with a common axis of rotation Z of the collector K. Similarly, one or more parts of the fluid ducts 20 can extend along circles, around a common axis of rotation Z of the collector K. The one or more fluid ducts 20, or parts thereof, can also extend in other directions, for example in longitudinal collector direction and/or yet other directions. Preferably, the one or more fluid ducts 20 are arranged and configured to provide a relatively homogeneous thermal conditioning of the collector, and particularly at least of the reflecting elements 11 of the collector and preferably also of other collector parts such as collector support parts 19 and coupling parts 12.

Each fluid duct 20 of the collector can have various shapes, can be provided in various ways, and can be made of various materials. For example, a fluid duct 20 can comprise, or be, at least one channel, conduit, tube, pipe, through-hole, or other suitable means to conduct fluid. For example, a fluid duct 20 can have a substantially circular cross-section, as shown in FIG. 2, and/or a different cross-section such as square, rectangular, hexagonal or any other suitable shape. Preferably, each fluid duct 20 is in good thermal contact with a respective collector part, to be thermally conditioned by fluid flowing through that fluid duct 20. For example, a fluid duct 20 can be an integral part of the collector. For example, reflecting elements 11 can be internally provided with one or more channels which form one or more of the fluid ducts 20. The fluid duct 20 can comprises, for example, a plurality of relatively small tubes which are integrally formed with the collector. Also, the one or more fluid ducts can be mounted substantially onto reflecting elements 11 and/or other collector parts 12, 19, for example onto and/or in outer surfaces 14 of reflecting elements 11 (as has been depicted in FIG. 2). One or more fluid ducts 20 can be mounted or coupled to the collector K in various ways, for example by welding, gluing, melting, electroforming, a suitable bonding method, riveting, clamping and/or in other suitable ways, depending for example on the materials used. For example, the one or more ducts 20 can be mounted onto one or more respective collector parts 11, 12, 19 during assembly and/or the forming of those collector parts 11, 12, 19. Besides, one or more parts of the at least one fluid duct 20 can be integrally formed in a respective collector part, and one or more other part of the at least one fluid duct 20 can be mounted or coupled substantially onto a respective collector part.

For example, a mentioned collector fluid duct 20 can be made of one or more plastics, metals, alloys and/or a combination of such materials and/or other materials. Also, fluid running through a fluid duct 20 can be in a good thermal contact with a respective collector part to be thermally conditioned by the fluid. To the skilled person it will be appreciated how such a good thermal contact can be achieved, for example by constructing the respective fluid duct 20 from material having a high thermal conductivity, and/or by mounting the fluid duct using a method which leads to a good thermal contact or by providing the fluid duct integrally in a respective collector part.

Upstream, the one or more fluid ducts 20 are coupled to a fluid supply line s1, to supply fluid to the fluid ducts 20. Part of this supply line s1 is depicted in FIG. 3. The supply line s1 is also schematically depicted in FIG. 1. Downstream, the fluid ducts 20 are coupled to a fluid exhaust line e1, to remove the fluid from the fluid ducts 20 of the collector K. Part of this exhaust line e1 is depicted in FIG. 3, whereas the exhaust line e1 is also schematically depicted in FIG. 1. In one embodiment, only one external fluid supply line s1 and only one external fluid exhaust line e1 can be provided. However, also, more than one external fluid supply line s1 an/or more that one external fluid exhaust line e1 can be provided. Each of the supply line s1 and exhaust line can be provided in various ways, for example by one or more suitable fluid channels, tubing, conduits and/or other devices.

The apparatus can be provided with a temperature conditioner configured to feed the first fluid to the fluid duct of the collector during a first period, for example when the collector is being heated up by radiation of the radiation source SO. Such a temperature conditioner can be configured and arranged in various ways. The temperature conditioner, or conditioning system, is schematically depicted in FIG. 1. For example, the thermal conditioner can comprise, or can be operatively coupled to, a fluid flow control system 4, 6, 9, wherein the fluid flow control system can be arranged to control which fluid is supplied to the fluid duct of the collector K. The temperature conditioner is preferably configured to supply first fluid of a certain relatively low temperature, to cool the collector. Also, for example, the temperature conditioner may be configured to control the temperature of the first fluid.

For example, the temperature conditioner can be provided with a first fluid supply 2 to supply a suitable first fluid. The first fluid supply 2 can be configured in various ways, depending for example on the type of first fluid. The first fluid supply can be configured to supply first fluid of a desired fluid temperature, to cool or maintain the collector K to/at a desired operating temperature, or in a desired operating temperature range, when the collector receives radiation from the source SO. For example, the first fluid supply can be provided with a cooling system to cool first fluid. Also, as an example, the first fluid supply can comprise a suitable reservoir or container, or be connected thereto, to hold first fluid, to be used. The fluid supply can also be constructed differently. The first fluid supply 2 can be connected or connectable to the supply line s1, to feed first fluid to the one or more fluid ducts 20 of the collector. For example, the temperature conditioner can be provided with a first flow regulator 4 which can bring the first fluid supply 2 in fluid communication with the supply line s1, and/or which can regulate the flow from the fluid supply to the supply line s1. Such a first flow regulator 4 can be arranged in various ways, for example with one or more suitable valves or other flow controllers.

Besides, in an embodiment, the temperature conditioner can be provided with a control 1. The control 1 can be configured, for example, to control the fluid flow of the first fluid. As an example, the control 1 can be configured to cooperate with the first fluid supply 2 and/or with the flow regulator 4, to control first fluid flow through the supply line s1 and the one or more fluid ducts 20 of the collector.

Besides, the apparatus can be provided with one or more fluid receivers 7, 8, two in the present embodiment, to receive fluid from the downstream part of the at least one fluid duct 20 of the collector. Each fluid receiver can be arranged in various ways (this will be clear to the skilled person), and can include, for example, a reservoir, drain, sewer and/or other receiver. Also, depending on the fluid used, one or more of the mentioned fluid receivers 7, 8 can be incorporated in one or more of the mentioned fluid supplies 2, 3, for example in a feedback or closed loop fluid circuit.

As an example, the downstream part of the collector fluid duct 20 can be connected or connectable to the fluid receivers 7, 8. In the embodiment of FIG. 1, a second flow regulator 6 is provided, which can be controlled to bring the exhaust line s1 in fluid communication with one of the fluid receivers 7, 8, or with the other 8, 7. Such a second flow regulator 6 can also be arranged in various ways, for example with one or more suitable valves or other flow controllers. Also, the control 1 of the thermal conditioner can be configured to cooperate with the second flow regulator 6, to control, which of the fluid receivers is in fluid connection with the exhaust line e1.

Besides, the thermal conditioner can be provided with one or more fluid pumps 9 (only one of which has been depicted), to pump fluid through the collector fluid ducts 20. Each of the pumps 9 can be configured in various ways, depending for example on the type of fluid to be pumped. For example, one or more of these fluid pumps can be arranged downstream with respect to the collector K, as in FIG. 1, and/or upstream with respect to the collector K, and/or in the collector K.

In the present embodiment, the temperature conditioner is also configured to feed a second fluid to the fluid duct 20 of the collector K, during a second period. For example, the temperature conditioner can be provided with a second fluid supply 3 to supply a suitable second fluid. The second fluid supply 3 can be configured in various ways, depending for example on the type of second fluid. The second fluid supply 3 can be configured to supply second fluid of a desired fluid temperature, to heat the collector K to a desired temperature. For example, the second fluid supply 3 can be provided with a heating system to heat the second fluid to a suitable or desired temperature. Also, as an example, the second fluid supply 3 can comprise a suitable reservoir or container, or be connected thereto, to hold second fluid, to be used.

In the present embodiment, particularly, the first fluid supply 2 and second fluid supply 3 are different fluid supplies. For example, in a preferred embodiment, the first fluid is a different fluid than the second fluid, such as is explained below concerning a liquid first fluid and a gaseous second fluid. For example, the first fluid can have a different specific heat capacity ($J \cdot kg^{-1} \cdot K^{-1}$) than the second fluid, for example a higher specific heat capacity. Alternatively, the first fluid supply 2 and second fluid supply 3 may be integrated with each other, for example in case the first fluid, used as first fluid in the mentioned first period, is also used as a second fluid during the mentioned second period.

The second fluid supply 3 can be connected or connectable to the supply line s1, to feed second fluid to the one or more fluid ducts 20 of the collector. For example, the mentioned first flow regulator 4 (as in FIG. 1), or an other flow regulator, can be configured to bring the second fluid supply 3 in fluid communication with the supply line s1. Besides, such a regulator 4 can also regulate the flow from the second fluid supply 3 to the supply line s1. A control 1 of the temperature conditioner can also, for example, control the flow of second fluid, for example when the control 1 can cooperate with the second fluid supply 3 and/or with the flow regulator 4.

The control 1 of the temperature conditioner can be configured in various ways. As an example only, the control 1 can be provided with one or more computers, micro controllers, microelectronics and/or other control means. Also, the control 1 can be at least partly a hardware based control or software based control. Besides, the control 1 can be provided with an automatic control and/or a manual control.

Preferably, the control 1 can control, which of the first fluid and second fluid is being supplied to the collector fluid ducts 20. For example, the control 1 can be configured to have the mentioned first fluid supplied to the ducts 20 of the collector K, during a first period when the collector K receives radiation R from the radiation source SO. Also, the control 1 can be configured to have the mentioned second fluid supplied to the ducts 20 of the collector K, during a second period when the collector K does not receive radiation R from the radiation source SO, or during part of such a second period. The mentioned second period can be, for example, a maintenance period, a period of apparatus idle time, a contamination removal period, cleaning period, or a different period. Besides, preferably, the temperature of the first fluid and/or of the second fluid, to be fed to the collector K during a respective period, can be controlled by the temperature conditioner, for example by the control 1.

The apparatus can be provided with one or more sensors 21, 22 to measure a certain condition of the collector K. For example, the collector K can be provided with one or more temperature sensors 21 to measure the temperature of at least part of the collector. Such sensors 21 can be configured in various ways, for example including one or more thermocouples, temperature-dependent materials and/or other sensors. Also, the apparatus can be configured to estimate or calculate the temperature of at least one or more parts of the collector K, for example using parameters: radiation flux of the radiation source, the amount of first fluid or second fluid being supplied to the collector K, the temperature of the first fluid or second fluid before entering the collector, the temperature of the first fluid or second fluid leaving the collector, the collector construction, the temperature and pressure of the environment of the collector, and/or other suitable parameters, as will be appreciated by one skilled in the art. In an embodiment, the mentioned control 1 of the temperature conditioner can be configured to carry out such an estimation and/or calculation.

Besides, the apparatus can be provided with one or more detectors 22, 23 to detect contamination of the collector. For example, such a detector 22, 23 can be arranged to measure a loss of radiation intensity between radiation entering the collector K and radiation exiting the collector K. Such a contamination detector can include, for example, a radiation emitter 22 to emit a measuring beam MB of radiation into the collector K, and a radiation sensor 23 to detect the last-mentioned beam MB of radiation after that beam has been reflected by the collector K (see FIG. 2). A loss of radiation intensity of the measuring beam MB, detected using the radiation sensor 23, can provide a good indication of contamination of collector surfaces 13. Also, the contamination detector can be configured differently. For example, it can be constructed to accurately measure the mass of the collector K, to measure the reflectivity of reflecting surfaces of the collector K, and/or otherwise.

In an embodiment, the collector temperature conditioner is configured to cooperate with the mentioned collector temperature sensors 21 and/or with contamination detectors 22, 23. As an example, the temperature sensors 21 and/or contamination detectors 22, 23 can be part of the collector temperature conditioning system. Also, in an embodiment, the control 1 of the temperature conditioner can cooperate with the collector temperature sensor and/or contamination detector 22, 23, to thermally condition the collector during the mentioned first and/or second period.

In an embodiment, the mentioned first fluid is a liquid. A suitable liquid is, for example, water. Also, different liquids can be used.

In an embodiment, the second fluid substantially is a gas or gas mixture. For example, the second fluid can simply be air. Air can provide a good, relatively fast, gradual heating and optional cooling of collector parts. Besides, air is cheap and relatively safe to use, for example compared to steam or hot heating liquids. Good results can be obtained when the second fluid is pressurized air, for example air having a pressure of more than about 1 bar, for example at least circa 5 bar, for example about 6 bar, or a different pressure. Also, preferably, the second fluid substantially contains no water. For example, the second fluid can be dry air.

In an embodiment, the mentioned temperature conditioner can be configured to provide a second fluid having a temperature of at least circa 130° C., for example at least 130° C., during at least part of a mentioned second period. For example, wherein the temperature conditioner can be configured to provide a second fluid having a temperature in the range of about 130° C.-200° C. Also, for example, the temperature conditioner can be configured to provide a second fluid having a temperature of about 150° C. It has been found that, using a fluid having such a temperature during a mentioned second period, or part of such a period, contamination can be removed relatively well from the collector, for example tin or tin oxide contamination, which contamination can be the result of the application of a Sn plasma EUV source as a mentioned radiation source SO. For example, removal of the contamination can involve a thermally induced desorption process, a thermally induced chemical process, and/or a different process, depending for example on the type of contamination involved. For example, one or more cleaning fluids g can be supplied to the collector. The one or more cleaning fluids can be involved in the removal of the contamination. For example, removal of the contamination can involve a thermally induced and/or cleaning fluids induced desorption process, a thermally induced and/or cleaning fluids induced chemical process, and/or a different process, depending for example on the type of contamination involved. For example, the cleaning fluids could be involved in cracking contamination, in accelerating and/or catalyzing a cleaning process, or differently.

Also, for example, the described temperature conditioner can be configured to provide a second fluid having a temperature that gradually rises from a first temperature to a second, higher, temperature during a predetermined first part of the second period. Besides, the temperature conditioner can also be configured to maintain the temperature of the second fluid at the second temperature during a predetermined second part of the second period. Moreover, the temperature conditioner can be configured to gradually lower the temperature of the second fluid after the predetermined second part of the second period. Thus, during use, the temperature of at least part of the collector, to which part the second fluid is being fed utilizing the at least one duct 20, can be altered gradually, so that thermally induced mechanical tension in the collector can be avoided. As an example only, the time involved to raise the temperature of the second fluid from the first to the second temperature can be in the range of about 10-20 min, or it can be a different amount of time, depending for example on the construction of the collector, the type of second fluid used, the flow rate of the second fluid and/or the pressure of the second fluid.

Also, in a further embodiment, the temperature conditioner and the fluid duct(s) 20 can be configured to supply different amounts of the second fluid to different parts of the collector. For example, the temperature conditioner and the at least one fluid duct 20 can be configured to homogeneously condition the temperature of the collector K. For example, the temperature conditioner can be arranged to provide collector parts having relatively high masses (such as outer collector shells 11) with relatively high volume flow rates of second fluid. For example, fluid ducts or duct parts of such collector parts can have relatively large inner diameters. Besides, such collector parts can be provided with a relatively large number of fluid ducts 20.

Also, for example, the temperature conditioner can be arranged to provided collector parts having lower masses (such as inner collector shells 11) with relatively lower volume flow rates of second fluid, compared to the relatively high volume flow rates. For example, fluid ducts or duct parts of such collector parts can have smaller inner diameters, compared to above-mentioned relatively large duct inner diameters. Besides, such relatively light-weight collector parts can be provided with a relatively small number of fluid ducts 20. Also, the temperature conditioner can be configured to supply different second fluids having different temperatures to different collector parts, to provide a relatively homogeneous temperature conditioning of the collector K.

Also, in a preferred embodiment, the apparatus is provided with a cleaning fluid supply GS (schematically depicted in FIG. 1) to supply a cleaning fluid g to the collector K. A flow of such cleaning fluid g is schematically indicated by arrows g in FIG. 2. For example, a cleaning fluid can include a suitable cleaning gas and/or suitable cleaning liquid, which can for example interact with contamination to be removed. The cleaning fluid supply GS can be configured to supply cleaning fluid to reflecting surfaces of the collector K, and/or to other collector areas. The type of cleaning fluid g can depend on the contamination to be removed various types of cleaning fluids g can be used. For example, the cleaning fluid can be or comprise molecular hydrogen, a hydrogen containing substance, a halogen, an interhalogen, a halogen-containing substance, Fluorine, Bromine, Iodine, Chlorine, hydrohalic acid, ammonia, and/or a combination of such cleaning fluids and/or other cleaning fluids. The cleaning fluid can be a substantially transparent. The cleaning fluid can be a gas and/or liquid which chemically reacts with contamination to be removed, and/or a gas and/or liquid which can induce, catalyze or improve desorption of contamination, or a different cleaning fluid. For example, in an embodiment, the removal of the contamination can be a combination of heating the respective collector part using the second fluid and the supply of a suitable cleaning fluid (or fluid mixture) to that collector part. The cleaning fluid supply GS can be configured in various ways, and can comprise for example a fluid shower or fluid supply lines to direct cleaning fluid (or fluid mixture) into the collector K. Such a cleaning fluid supply can also be configured differently.

As follows from the above, the embodiment depicted in FIGS. 1-3 can be used in a method of manufacturing a device, the method comprising: providing a substrate W; providing a radiation source SO; transmitting radiation R from the radiation source to an illumination system through a collector K; providing a beam of radiation using the illumination system; imparting the beam with a cross-sectional pattern to form a patterned beam of radiation; and projecting the patterned beam of radiation onto a target portion of the substrate W.

In that case, the temperature conditioner can cool the collector K using the mentioned first fluid during at least a mentioned first period, particularly when the collector K receives radiation R from the radiation source SO. The first fluid can be supplied from the respective supply 2, via regulator 4 and supply line s1 to the fluid duct(s) 20 of the collector K. Downstream, the first fluid can be exhausted via exhaust line e1 and the exhaust regulator 6 to the respective fluid receiver 6. The first fluid, to be fed to the collector K, can be maintained at a relatively constant, relatively low temperature, for example a temperature lower than about 100° C., such as room temperature or a different low temperature, to cool the collector K (i.e. to remove heat from the collector K). In an embodiment, the flow and/or temperature of first fluid is controlled by the control 1 of the temperature conditioner. In an embodiment, the collector K is maintained at a substantially constant average operating temperature, or in a desired temperature range, by supplying the first fluid to the at least one fluid duct 20 of the collector K. This can depend, for example, on the amount and type of radiation the collector K receives from the source SO, and on other factors.

Alternatively, for example, the first fluid can be held at a temperature higher than about 100° C. For example, the first fluid can be used to maintain the collector K at a relatively constant operating temperature, for example an operating temperature above 100° C. For example, a first fluid can be used to reduce thermal drift of the collector, by heating the collector. Such a method is described, for example, in US2005157284 (Moors et al.) filed the 26 Jan. 2004, in name of the applicant, which US application is incorporated in the present application by reference in its entirety.

The collector K may become contaminated, for example after a certain period of operation of the radiation source SO. Optionally, such contamination is being detected or measured, for example by a contamination detector assembly 22, 23. On the other hand, the amount of contamination can be estimated or calculated, for example by control 1, and/or in a different way. The contamination can be at least partly emanating from the radiation source SO, depending on the construction and type of the source SO. For example, the contamination can include tin and/or tin oxide contamination.

In at least one second period, for example a contamination-removal period or a cleaning sequence, for example before of after a mentioned first period, the collector K is being heated using a mentioned second fluid. The second fluid is being fed to the same ducts 20, which where being used to conduct the first fluid during the first period. Particularly, the second fluid replaces the first fluid, in the collector ducts 20, during the second period. By heating the collector K, using the second fluid, at least part of the contamination can be removed from the collector K. During this second period, preferably, the collector K does not receive radiation from the radiation source SO.

The start of the second period can be determined, for example, by the control 1 of the temperature conditioner. Also, the second period can be during a idle mode of the apparatus, a maintenance period, it can be part of a cleaning procedure and/or it can depend on different factors determined, for example, by the control 1 of the temperature conditioner. For example, the second period can be started automatically and/or manually, for example by or under influence of the control 1. For example, the control 1 can start such a second period, in case collector contamination, detected by a mentioned contamination detector 22, 23 and/or calculated of estimated, exceeds a certain threshold value. Also, the control 1 can include a timer to start the second period at a predetermined time. Besides, the control 1 can be configured to start the second period during a certain idle mode or maintenance period of the apparatus As mentioned above, during the second period, the collector K can be heated using the mentioned second fluid. Preferably, such heating of the collector K is controlled by the mentioned control 1. In an embodiment, the control 1 cooperates with one or more temperature sensors 21 of the collector K to provide a desired, preferably gradual, heating of the collector K. Also, during the second period, a suitable cleaning fluid g (or cleaning fluid mixture g) can be fed to the collector, for example to the collector elements 11, and particularly to the reflecting surfaces of those elements 11. For example, the supply of cleaning fluid can also be under the control of the control 1.

The second fluid can be supplied from the respective supply 3, via regulator 4 and supply line s1 to the fluid duct(s) 20 of the collector K. Downstream, the second fluid can be exhausted via exhaust line e1 and the exhaust flow regulator 6 to the respective second fluid receiver 7. For example, the flow of second fluid can be controlled by the control 1 of the temperature conditioner. The control 1 can control the mentioned pump or pumps 9 and the flow regulators 4, 6, to switch between supply of first fluid and second fluid to the duct(s) 20, and to control flow speeds of the fluids.

As has been mentioned above, the second fluid can be a gas or gas mixture, for example pressurized air. Pressurized air has a relatively large heat capacity with respect to atmospheric air. Therefore, pressurized air can feed a relatively large quantity of heat to the collector to informingly heat up the collector K, or parts thereof. Also, during use, for example at the start of the second period, the temperature of the flowing second fluid may gradually rise from a first temperature to a second, higher, temperature, for example during a predetermined first part of the second period. For example, the first temperature may be substantially the same as a temperature of the mentioned first fluid, before the first fluid enters the collector K. Besides, for example, the ramping or temperature rise of the second fluid can depend amongst others on the size and construction of the collector K. In an embodiment, changes of the temperature of the second fluid are such, that thermal stresses of and/or in collector parts can be avoided or reduced. Besides, as follows from the above, during use, different second fluids—having for example different first and/or second temperatures—can be provided.

As follows from the above, for example, the first temperature can be lower than about 100° C. As an example, the mentioned first temperature can be room temperature (about 20° C.) or a different temperature.

The mentioned second temperature of the second fluid can be, for example at least circa 100° C. or at least circa 130° C. For example, wherein second temperature can be in the range of about 130° C.-200° C. Also, for example, the second temperature can be about 150° C. In this way, the collector can at least be heated to circa 130° C. by the second fluid, flowing through the mentioned duct 20. For example, the collector can at least be heated to a temperature in the range of about circa 130-200° C. by the second fluid.

Alternatively, the temperature of the second fluid can be about 100° C., or lower.

Preferably, as follows from the above, different amounts of the second fluid may be supplied to different parts of the collector K to provide a substantially homogeneously thermal conditioning of the temperature of the collector K. For example, inner collector shells 11 may be thermally conditioned using smaller amounts of second fluid than larger outer collector shells 11.

During use, the temperature of the second fluid can be maintained at the second temperature during a predetermined second part of the second period. Preferably, the predetermined second part of the second period is sufficiently long to provide a desired contamination removal of collector contamination. As follows from the above, for example, during use, removal of the contamination can involve a thermally induced desorption process, a thermally induced chemical process, a process involving one or more cleaning fluids g (for example one or more cleaning gasses or cleaning liquids) which can be supplied to the collector K, and/or a different process, depending for example on the type of contamination involved.

The temperature of the second fluid can then be lowered, for example gradually, back to a mentioned first temperature or a different temperature. During the lowering of the second fluid temperature, the second fluid can function, for example, to gradually lower the temperature of at least part of the collector K also to a mentioned first temperature, or another temperature.

After that, for example another first period can be started, wherein the apparatus can be used to perform a lithography process, to manufacture devices.

By heating the collector K to a desired second temperature, utilizing fluid flowing through collector ducts that are also used (but during a different—mentioned first—period) to feed first fluid through/along the collector K, the collector K can be cooled and heated in a simple, inexpensive and efficient manner, utilizing the same collector duct or ducts 20. The present development can be easily implemented without adding much complexity to the apparatus, while human safety regulations are not an issue, or can only be a relatively small issue.

Besides, the mentioned second fluid can also be used to—preferably gradually—heat various collector parts to desired temperatures. These various collector parts can include, for example, a number and preferably all of the reflecting elements, as well as mentioned collector coupling member 12, collector holder or support structure 19, and/or other collector parts.

As follows from the above, a radiation collector K can be heated up and cooled down with hot/cold fluid (preferably gas) during and after a certain cleaning sequence. In an embodiment, the mentioned source is a Sn EUV source, and the collector K can be gradually covered with a layer of Sn and SnOx when firing the source SO. Such a deposition might lead to a large loss of reflectivity of reflecting collector surfaces. In the present embodiment, the application of a chemical cleaning sequence in order to regain the original reflectivity can be prevented or diminished. Also, the application of relatively impractible heating methods such as providing the collector with an electrical heating device, using optical absorption, using hot water or hot oil can be avoided, particularly in case a gaseous second fluid is utilized. For example, heating methods can be impractible due to light loss, high currents, possible hotspots or "cold" areas, machine safety issues, or regular inspections requirements for human safety with e.g. hot water/oil leads.

For example, in an embodiment, the radiation collector K can be provided with water-cooling. The mentioned duct 20 can comprise small tubes incorporated around collector shells 11, for example during an electroforming process. During a mentioned first period, these tubes can be flushed, for example, with cooling water in order to prevent or reduce thermal drift of the collector K during operation of the source SO. According to an embodiment, such relatively small tubes can be used to heat-up and optically cool-down the collector K during a mentioned contamination-removal period.

For example, first, cooling water can be blown out from the tubes 20. Then hot air can be pumped through the tubes 20 to heat-up the collector K. In an embodiment, there is an excellent thermal contact between each tube 20 and the respective collector shell or shells 11, and preferably a good thermal conductance of the shells 11 themselves, so that a rapid and uniform heating of the shells 11 can be accomplished. After such a cleaning sequence, the collector shells 11 can for example be gradually cooled down with "cold" air until the shells 11 are cooled down sufficiently to apply water again. In order to prevent thermal stress, preferably, the heating up and cooling down of the collector K is performed in a well controlled gradual fashion, such as has been described above. In that case, cause mechanical damage to the collector unit can be prevented.

The present apparatus, in accordance with an embodiment of the invention, temperature conditioner and/or respective collector K, is easy to implement. For example, heating up/cooling down of the collector K can be achieved using off-the-shelf parts. Well controlled temperature transient can be achieved to prevent thermal stresses of the collector K. For example, by using hot/cold air in stead of a hot/cold liquid or steam, substantially no additional measures are required to fulfill the "stoomwezen" requirements, which concerning steam. For example, the second fluid can be regular clean, dry air (CDA). For example, the second fluid substantially contains no water. Other gasses are also possible to be used as second fluid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method to remove contamination from a reflecting surface of a radiation collector for use in a lithographic apparatus, the method comprising supplying heated pressurized air in thermal contact with the collector to heat up the collector to a temperature wherein at least part of the contamination is removed from the collector.

2. A method according to claim 1, wherein the pressure of the pressurized air is more than about 1 bar.

3. A method according to claim 1, wherein the pressure of the pressurized air is more than about 5 bar.

4. A method according to claim 1, wherein the temperature of the heated air is higher than about 100° C.

5. A method according to claim 1, wherein the temperature of the heated air is in the range of circa 130° C.-200° C.

6. A method according to claim 1, wherein the air is dry air.

7. A method according to claim 1, wherein a cleaning fluid is supplied to the reflecting surface of the collector, to at least partially remove contamination from the reflecting surface.

8. A radiation collector for use in a lithographic apparatus, the collector comprising a temperature conditioner to supply heated pressurized air in thermal contact with the collector to heat up the collector to a temperature such that contamination is removed from a reflecting surface of the collector.

9. A collector according to claim 8, wherein the pressure of the pressurized air is more than about 1 bar.

10. A collector according to claim 8, wherein the pressure of the pressurized air is more than about 5 bar.

11. A collector according to claim 8, wherein the temperature of the heated air is higher than about 100° C.

12. A collector according to claim 8, wherein the temperature of the heated air is in the range of circa 130° C.-200° C.

13. A collector according to claim 8, wherein the air is dry air.

14. A collector according to claim 8, wherein a cleaning fluid is supplied to the reflecting surface of the collector, to at least partially remove contamination from the reflecting surface.

15. A lithographic apparatus comprising:
a collector that is constructed to receive radiation from a radiation source and to transmit radiation to an illumination system, and
a temperature conditioner to supply heated pressurized air in thermal contact with the collector to heat up the collector to a temperature such that contamination is removed from a reflecting surface of the collector.

16. A lithographic apparatus according to claim 15, wherein the pressure of the air is more than about 1 bar.

17. A lithographic apparatus according to claim 15, wherein the temperature of the heated air is higher than about 100° C.

18. A lithographic apparatus according to claim 15, wherein a cleaning fluid is supplied to the reflecting surface of the collector, to at least partially remove contamination from the reflecting surface.

19. A lithographic apparatus according to claim 15, wherein the pressure of the pressurized air is more than about 5 bar.

20. A lithographic apparatus according to claim 15, wherein the temperature of the heated air is in the range of circa 130° C.-200° C.

* * * * *